(12) United States Patent
Jain et al.

(10) Patent No.: US 8,013,635 B2
(45) Date of Patent: Sep. 6, 2011

(54) MULTI-MODE CIRCUIT AND A METHOD FOR PREVENTING DEGRADATION IN THE MULTI-MODE CIRCUIT

(75) Inventors: Palkesh Jain, Bangalore (IN); Nagaraj Savithri, Richardson, TX (US); Usha Narasimha, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/703,793

(22) Filed: Feb. 11, 2010

(65) Prior Publication Data

US 2011/0193588 A1  Aug. 11, 2011

(51) Int. Cl.
*H03K 19/00* (2006.01)
(52) U.S. Cl. ............ 326/93; 326/95; 327/291; 327/416; 327/176
(58) Field of Classification Search .............. 326/93, 326/95, 98; 327/291, 295, 176, 415, 416
See application file for complete search history.

(56) References Cited

U.S. PATENT DOCUMENTS

| | | | | |
|---|---|---|---|---|
| 6,373,290 B1 * | 4/2002 | Forbes | ............................ | 326/98 |
| 6,724,231 B2 * | 4/2004 | Yoshikawa | .................... | 327/291 |
| 7,724,036 B2 * | 5/2010 | Das | ................................ | 326/93 |

* cited by examiner

*Primary Examiner* — Daniel D Chang
(74) *Attorney, Agent, or Firm* — Dawn V. Stephens; Wade James Brady, III; Frederick J. Telecky, Jr.

(57) ABSTRACT

Multi-mode circuit (the circuit) and a method for preventing degradation in the circuit. The circuit includes a first transistor that enables functioning of the circuit in a first mode. The first transistor is responsive to a first signal to become inactive when the circuit enters into a second mode, thereby preventing degradation of the first transistor when the circuit enters into the second mode. A second transistor is coupled to the first transistor. The second transistor is responsive to a second signal to generate a third signal. A third transistor is coupled to the second transistor. The third transistor is responsive to the third signal to become inactive when the circuit enters into the second mode, thereby preventing degradation of the third transistor when the circuit enters into the second mode.

17 Claims, 5 Drawing Sheets

MULTI-MODE CIRCUIT AND A METHOD FOR PREVENTING DEGRADATION IN THE MULTI-MODE CIRCUIT

TECHNICAL FIELD

Embodiments of the disclosure relate to a multi-mode circuit and a method for preventing degradation in the multi-mode circuit.

BACKGROUND

A system-on-chip (SoC) includes various circuits. Each circuit can operate in one or modes, for example a functional mode and a power saving mode. The power saving mode can also be referred to as a clock gating mode. While clock gating is a useful method in reducing the active power of the circuit to minimal level, the method has fundamental reliability limitations that need to be addressed.

An example of an existing clock tree 100 is illustrated in FIG. 1 (prior art). The clock tree 100 includes a plurality of blocks, for example a block 105A and a block 105N. Each block includes a plurality of inverter cells. The plurality of inverter cells may also be referred to as a plurality of clock tree elements of the clock tree 100. For example, the block 105A includes a positive metal oxide semiconductor (PMOS) transistor 110A and a negative metal oxide semiconductor (NMOS) transistor 115A defining a first inverter cell. A PMOS transistor 110B and an NMOS transistor 115B define a second inverter cell. The PMOS transistor 110A and the PMOS transistor 110B enables functioning of the clock tree 100. During gating, the clock tree 100 receives a gating signal at a node 120. However, when the gating signal is at logic level LO then at least one PMOS transistor of each block is active. For example, when the gating signal is at logic level LO (falling edge) then the PMOS transistor 110A is active and hence is subject to Negative Bias Temperature Instability (NBTI) effect. The NBTI effect degrades the PMOS transistor 110A and reduces timing performance of the PMOS transistor 110A. In a similar way, at least one PMOS transistor, for example the PMOS transistor 110B, of each block is active and gets degraded when the gating signal is at logic level HI (rising edge). Also, at least one NMOS transistor, for example the NMOS transistor 115A, that is active when the gating signal is at logic level HI can get degraded due to a positive bias temperature instability (PBTI) effect. Degrading of PMOS transistors during falling edge and rising edge of the gating signal leads to asymmetric aging of the PMOS transistors. Hence, the clock tree 100 is prone to asymmetric aging of the PMOS transistors which in turn may further lead to functional failures of the clock tree 100 and other circuits on the SoC by generating delays.

SUMMARY

An example of a circuit having multiple operating modes includes a first transistor that enables functioning of the circuit in a first mode. The first transistor is responsive to a first signal to become inactive when the circuit enters into a second mode, thereby preventing degradation of the first transistor when the circuit enters into the second mode. Further, the circuit includes a second transistor coupled to the first transistor. The second transistor is responsive to a second signal to generate a third signal. The circuit also includes a third transistor coupled to the second transistor. The third transistor is responsive to the third signal to become inactive when the circuit enters into the second mode, thereby preventing degradation of the third transistor when the circuit enters into the second mode.

An example of a clock tree having multiple operating modes includes a plurality of transistor based clock tree elements (CTEs). A first one of the plurality of CTEs includes a first transistor in parallel connection with a second transistor. A second one of the plurality of the CTEs includes a third transistor in parallel connection with a fourth transistor. The third transistor is coupled to the second transistor. The first transistor is responsive to an input signal to enter into an inactive state when the clock tree enters into a gating mode and the second transistor is responsive to a gating signal to inactivate the third transistor, thereby preventing degradation of the first transistor and the third transistor when the clock tree enters into the gating mode.

An example of a method for minimizing degradation in a circuit having multiple operating modes includes generating a first signal that inactivates a first transistor when the circuit enters into a second mode from a first mode, thereby minimizing degradation of the first transistor. The first transistor enables functioning of the circuit in the first mode. The method further includes generating a second signal that activates a second transistor, when the circuit enters into the second mode, which in turn inactivates a third transistor, thereby minimizing degradation of the third transistor. The third transistor enables the functioning of the circuit and is subsequent to the first transistor.

BRIEF DESCRIPTION OF THE VIEWS OF DRAWINGS

DETAILED DESCRIPTION OF THE EMBODIMENTS

Figure 1:
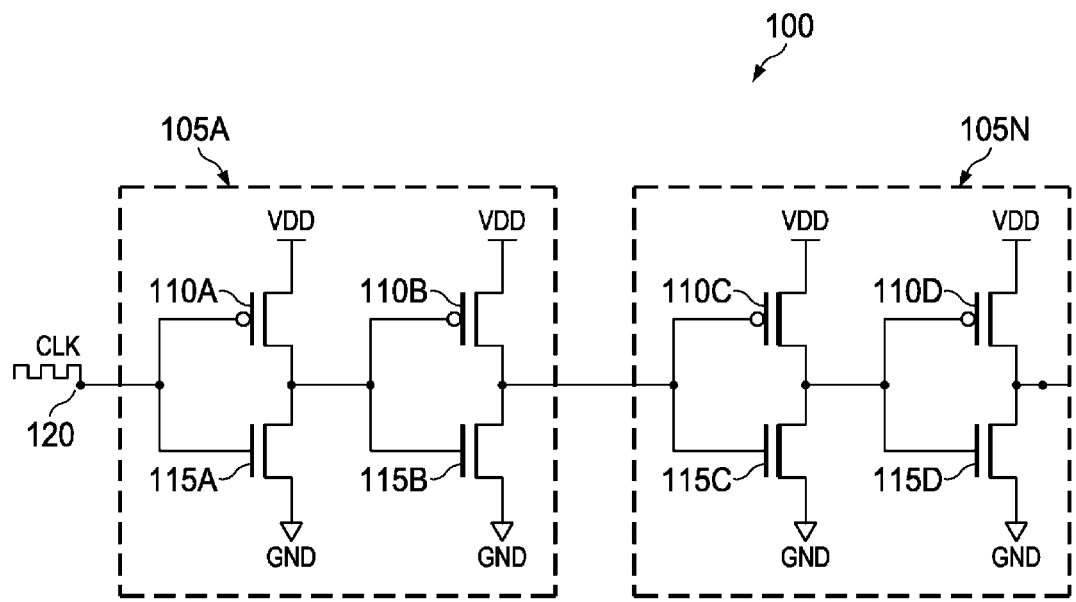
FIG. 1 illustrates a clock tree in accordance with the prior art.
Figure 2:
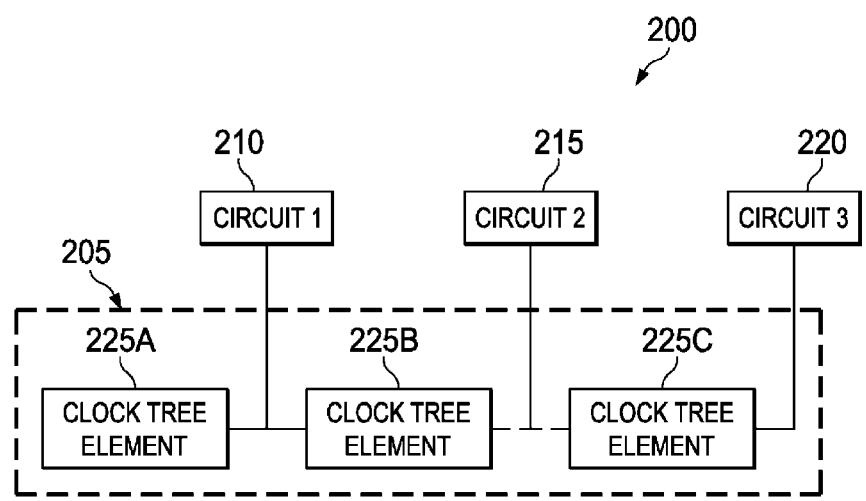
FIG. 2 illustrates a system in accordance with one embodiment.

FIG. 2 illustrates a system 200. The system 200 includes a clock tree 205 coupled to one or more circuits, for example a circuit 210, a circuit 215, and a circuit 220. The clock tree 205 includes a plurality of transistor based clock tree elements (CTEs), for example a CTE 225A, a CTE 225B, and a CTE 225C. The CTEs can be NAND based CTEs or NOR based CTEs.

The clock tree 205 can be included in various integrated circuits and system-on-chips (SoCs). Accordingly, clock signals generated by the clock tree 205 can be used as a reference to control timing of events in the integrated circuits or the SoCs. The clock tree 205 can also be referred to as a clock distribution network. The clock tree 205 distributes the clock signals to various elements in the integrated circuits or the SoCs. Various processes in an integrated circuit can be clocked using the clock signals from the clock tree 205, to enable synchronized processing. The clock signals control operation of the integrated circuit by synchronizing time intervals during which data can be communicated from one portion of the integrated circuit to another portion or another integrated circuit.

The circuits can have multiple operating modes, for example a functional mode and a gating mode, and each circuit can be referred to as a multi-mode circuit. The functional mode can be referred to as a first mode, and the gating mode or a mode other than the functional mode can be referred to as a second mode. For example, if there are two functional modes than one functional mode can be referred to as the first mode and other functional mode can be referred to as the second mode. Certain portions of a circuit can be active when the circuit is in the functional mode and can be referred to as functional portions of the circuit or critical portions of the circuit. The critical portions can be inactive during gating to prevent degradation of the critical portions. For example, a flip-flop circuit can have positive metal oxide semiconductor (PMOS) transistors as active when the flip-flop circuit is in the functional mode and can have the PMOS transistors as inactive when the flip-flop circuit is in the gating mode to prevent the PMOS transistors from a negative bias temperature instability (NBTI) effect. The NBTI effect can occur due to applied voltage, temperature, aging or usage of PMOS transistors. The NBTI effect degrades the PMOS transistors and reduces timing performance of the PMOS transistors. Either the clock tree 205 with a gating logic can be used to inactivate the PMOS transistors during the gating mode or a circuitry within the flip-flop circuit can be used to inactivate the PMOS transistors. The circuitry within the flip-flop circuit can include transistors that are redundant during the functional mode but can be active during the gating mode to enable the PMOS transistors to become inactive during the gating mode. Such transistors that are redundant during the functional mode can be referred to as non-critical transistors that forms non-critical portion.

The clock tree 205 can also work in the multiple operating modes, for example a clock generating mode (the first mode) and the gating mode (the second mode). In one example, critical portions of the clock tree 205 are active and generate clock signals in the clock generating mode, and are inactive during the gating mode.

Figure 3:
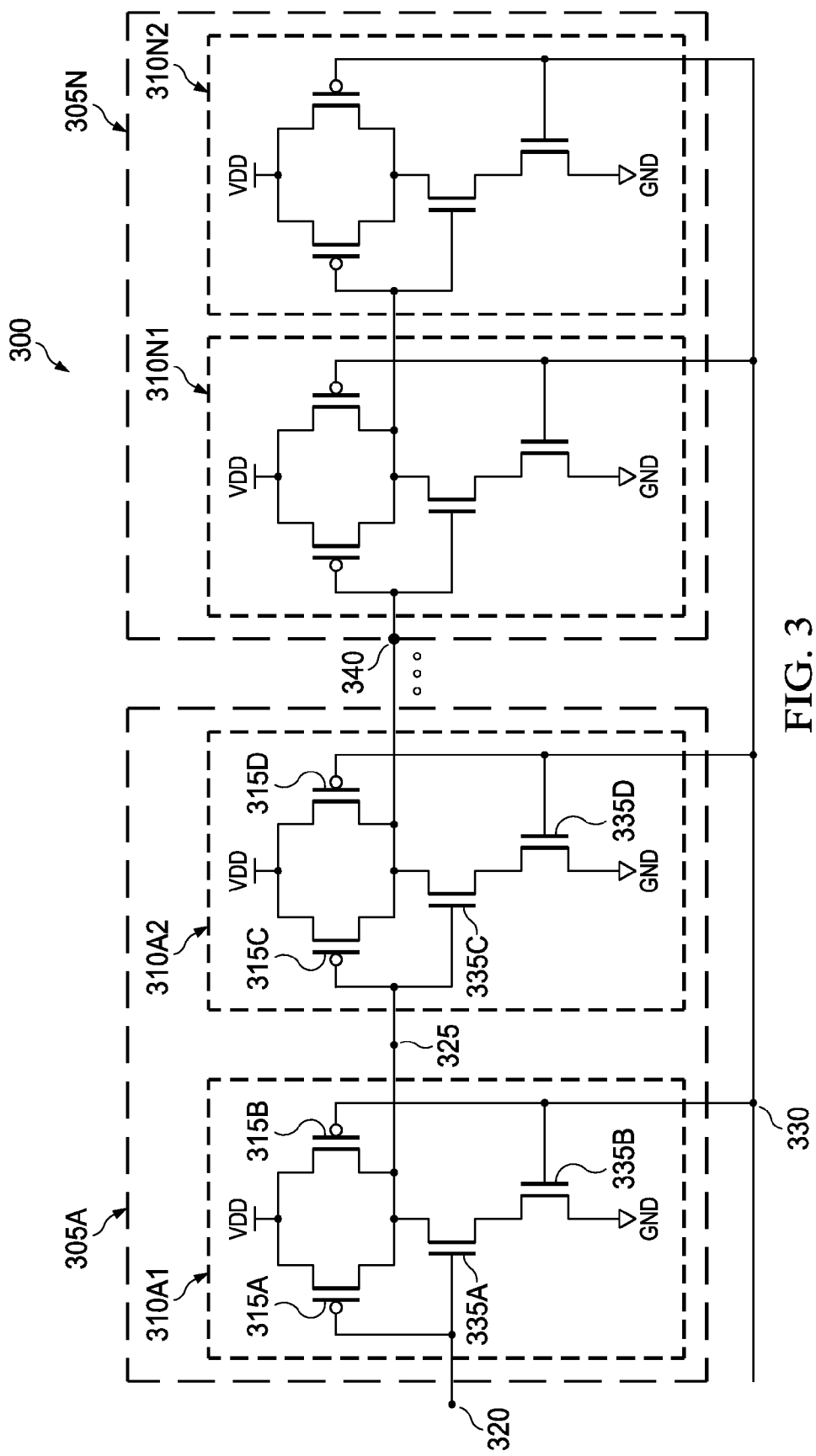
FIG. 3 illustrates a clock tree in accordance with one embodiment.
Figure 4:
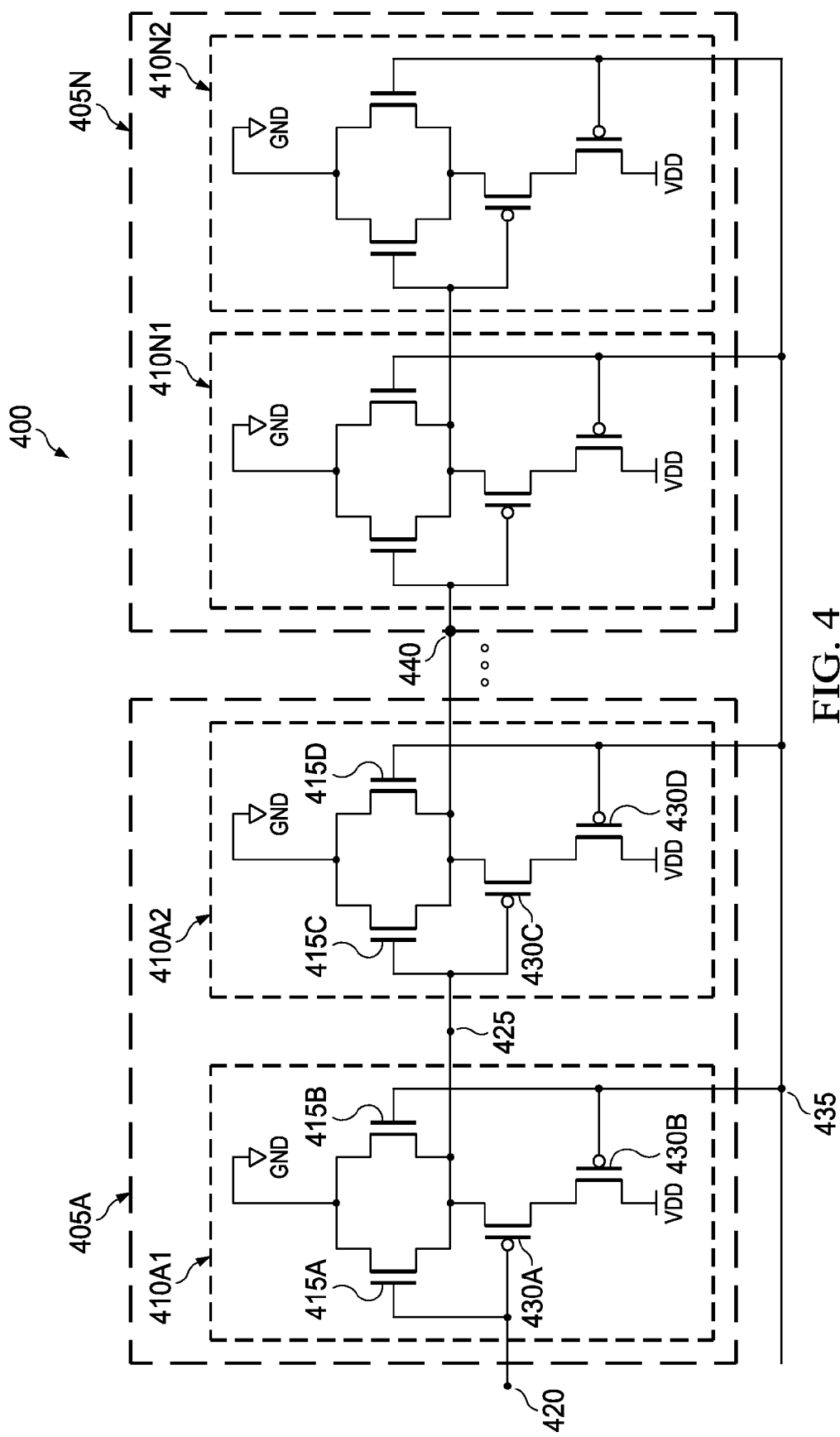
FIG. 4 illustrates a clock tree in accordance with another embodiment.

It is noted that the FIG. 3 and the FIG. 4 are explained using a clock tree 300 and a clock tree 400 including the critical portions and the circuitry that prevents degradation of the critical portions during the gating mode. However, a similar approach, of having the circuitry that is redundant during the clock generating mode but active during the gating mode, can be used to prevent degradation of the critical portions in the circuit with multiple operating modes.

FIG. 3 illustrates the clock tree 300. The clock tree 300 includes a plurality of blocks, for example a block 305A and a block 305N. The block 305A is coupled to the block 305N. Each block includes a plurality of CTEs. Each CTE includes a NAND cell and can be referred to as a NAND based CTE. For example, the block 305A includes a NAND cell 310A1 and a NAND cell 310A2, and the block 305N includes a NAND cell 310N1 and a NAND cell 310N2.

The NAND cell 310A1 includes a PMOS transistor 315A (a first transistor) in parallel connection to a PMOS transistor 315B (a second transistor). The PMOS transistor 315A has a gate coupled to a node 320, a drain coupled to a node 325, and a source coupled to a power supply (VDD). The PMOS transistor 315B has a gate coupled to a node 330, a drain coupled to the node 325 and a source coupled to the power supply.

The NAND cell 310A1 further includes a plurality of negative metal oxide semiconductor (NMOS) transistors, for example an NMOS transistor 335A (a first NMOS transistor also referred to as a fifth transistor), and an NMOS transistor 335B (a second NMOS transistor also referred to as a sixth transistor), in a series connection with the PMOS transistor 315A. The NMOS transistor 335B has a source coupled to a ground supply (GND), a gate coupled to the node 330 and a drain coupled to a source of the NMOS transistor 335A. The NMOS transistor 335A has a gate coupled to the node 320, and a drain coupled to the node 325.

The NAND cell 310A2 includes a PMOS transistor 315C (a third transistor) in parallel connection to a PMOS transistor 315D (a fourth transistor). The PMOS transistor 315C has a gate coupled to the node 325, a drain coupled to a node 340, and a source coupled to the power supply. The PMOS transistor 315D has a gate coupled to the node 330, a drain coupled to the node 340 and a source coupled to the power supply.

The NAND cell 310A2 further includes an NMOS transistor 335C (a third NMOS transistor also referred to as a seventh transistor) and an NMOS transistor 335D (a fourth NMOS transistor also referred to as an eighth transistor) in the series connection with the PMOS transistor 315C. The NMOS transistor 335D has a source coupled to a ground supply, a gate coupled to the node 330 and a drain coupled to a source of the NMOS transistor 335C. The NMOS transistor 335C has a gate coupled to the node 325, and a drain coupled to the node 340.

In some embodiments, the PMOS transistor 315A and the PMOS transistor 315C are widely sized than the PMOS transistor 315B and the PMOS transistor 315D, respectively. During the clock generating mode, the clock signals, generated by the clock tree 300, pass through the widely sized transistors. During the gating mode, the clock signals pass through the smaller sized transistors, the smaller sized transistors being degraded. This minimizes different ageing during the multiple modes of the clock tree 300.

The working of the clock tree 300 in the clock generating mode and the gating mode is explained now.

During the clock generating mode, an input signal at the node 320 can be at a logic level LO. The input signal can be generated by a circuit external to the clock tree 300. The PMOS transistor 315A is active in response to the input signal and generates an output signal, at a logic level HI, at the node 325. A gating signal (a second signal) at the node 330 is at a logic level HI. The PMOS transistor 315B is inactive in response to the gating signal. The NMOS transistor 335A is inactive in response to the input signal and the NMOS transistor 335B is active in response to the gating signal. The NMOS transistor 335C is active in response to the output signal at the node 325 and the NMOS transistor 335D is active in response to the gating signal. Another output signal is obtained at the node 340 at the logic level LO. Any one of the output signal at the node 325 or the output signal at the node 340 can be used as a clock signal based on requirement of various circuits driven by the clock tree 300. The PMOS transistor 315D is inactive in response to the gating signal.

When the input signal at the node 320 is at the logic level LO, the PMOS transistor 315A enables functioning of the clock tree 300 by generating the output signal at the node 325. The NMOS transistor 335A and the PMOS transistor 315C enables functioning of the clock tree 300 in conjunction with the PMOS transistor 315A by being inactive. The NMOS transistor 335C enables functioning of the clock tree 300 by being active and generating the output signal at the node 340.

When the input signal at the node 320 is at the logic level HI during the clock generating mode then the PMOS transistor 315A, the PMOS transistor 315B, and the PMOS transistor 315D are inactive. The NMOS transistor 335A, the NMOS transistor 335B, and the NMOS transistor 335D are active. The output signal at the node 325 is at the logic level LO. The PMOS transistor 315C is active and the NMOS transistor 335C is inactive in response to the output signal at the node 325. The output signal at the node 340 is at the logic level HI.

When the input signal at the node 320 is at the logic level HI, the PMOS transistor 315A, and the NMOS transistor 335C enables functioning of the clock tree 300 by being inactive. The NMOS transistor 335A enables functioning of the clock tree 300 by generating the output signal at the node 325. The PMOS transistor 315C enables functioning of the clock tree 300 by generating the output signal at the node 340.

The PMOS transistor 315A, the PMOS transistor 315C, the NMOS transistor 335A and the NMOS transistor 335C can together be referred to as the critical portion of the clock tree 300. Each of the PMOS transistor 315A, the PMOS transistor 315C, the NMOS transistor 335A and the NMOS transistor 335C can be referred to as a critical transistor. The PMOS transistor 315A and the PMOS transistor 315C can be subject to the NBTI effect if kept active during the gating mode.

During the gating mode, the input signal (first signal) at the node 320 is at the logic level HI. The PMOS transistor 315A is inactive and remains non-degraded. The gating signal (second signal) is at the logic level LO. The PMOS transistor 315B (non-critical transistor) is active in response to the gating signal and generates the output signal (third signal) at the node 325. The output signal at the node 325, which is at the logic level HI, inactivates the PMOS transistor 315C and prevents degradation. The PMOS transistor 315C (second critical transistor) can be referred to as the critical transistor subsequent to the PMOS transistor 315A (first critical transistor). Similarly, the PMOS transistor 315D is active in response to the gating signal and helps in inactivating PMOS transistor of the subsequent critical transistor. The NMOS transistor 335B and the NMOS transistor 335D are inactive, and the NMOS transistor 335A and the NMOS transistor 335C are active.

In some embodiments, the clock tree 300 includes several blocks. It is noted that the functioning and structure of each block can be similar to that of the block 305A.

FIG. 4 illustrates the clock tree 400. The clock tree 400 includes a plurality blocks, for example a block 405A and a block 405N. The block 405A is coupled to the block 405N. Each block includes a plurality of CTEs. Each CTE includes a NOR cell and can be referred to as a NOR based CTE. For example, the block 405A includes a NOR cell 410A1 and a NOR cell 410A2. and the block 405N includes a NOR cell 410N1 and a NOR cell 410N2.

The NOR cell 410A1 includes an NMOS transistor 415A (first transistor) in parallel connection to an NMOS transistor 415B (second transistor). The NMOS transistor 415A has a gate coupled to a node 420, a drain coupled to a node 425, and a source coupled to a ground supply (GND). The NMOS transistor 415B has a gate coupled to a node 435, a drain coupled to the node 425 and a source coupled to the ground supply.

The NOR cell 410A1 further includes a plurality of PMOS transistors, for example a PMOS transistor 430A (a first PMOS transistor also referred to as a fifth transistor), and a PMOS transistor 430B (a second PMOS transistor also referred to as a sixth transistor), in series connection with the NMOS transistor 415A. The PMOS transistor 430B has a source coupled to the positive supply (VDD), a gate coupled to the node 435 and a drain coupled to a source of the PMOS transistor 430A. The PMOS transistor 430A has a gate coupled to the node 420, and a drain coupled to the node 425.

The NOR cell 410A2 includes an NMOS transistor 415C (third transistor) in parallel connection to an NMOS transistor 415D (fourth transistor). The NMOS transistor 415C has a gate coupled to the node 425, a drain coupled to a node 440, and a source coupled to the ground supply (GND). The NMOS transistor 415D has a gate coupled to the node 435, a drain coupled to the node 440 and a source coupled to the ground supply (GND).

The NOR cell 410A2 includes a PMOS transistor 430C (a third PMOS transistor also referred to as a seventh transistor), and a PMOS transistor 430D (a fourth PMOS transistor also referred to as an eighth transistor), in series connection with the NMOS transistor 415C. The PMOS transistor 430D has a source coupled to the positive supply (VDD), a gate coupled to the node 435 and a drain coupled to a source of the PMOS transistor 430C. The PMOS transistor 430C has a gate coupled to the node 425, and a drain coupled to the node 440.

In some embodiments, the NMOS transistor 415A and the NMOS transistor 415C are widely sized than the NMOS transistor 415B and the NMOS transistor 415D, respectively. During the clock generating mode, the clock signals, generated by the clock tree 400, pass through the widely sized transistors. During the gating mode, the clock signals pass through the smaller sized transistors, the smaller sized transistors being degraded. This minimizes different ageing during the multiple modes of the clock tree 400.

The working of the clock tree 400 in the clock generating mode and the gating mode is explained now.

During the clock generating mode, an input signal at the node 420 can be at a logic level HI. The input signal can be generated by a circuit external to the clock tree 400. The NMOS transistor 415A is active, in response to the input signal and generates an output signal, at a logic level LO, at the node 425. A gating signal (a second signal) at the node 435 is at a logic level LO. The NMOS transistor 415B is inactive in response to the gating signal. The PMOS transistor 430A is inactive in response to the input signal and the PMOS transistor 430B is active in response to the gating signal. The PMOS transistor 430C is active in response to the output signal at the node 425 and the PMOS transistor 430D is active in response to the gating signal. Another output signal is obtained at the node 440 at the logic level HI. Any one of the output signal at the node 425 or the output signal at the node 440 can be used as a clock signal based on requirement of various circuits driven by the clock tree 400. The NMOS transistor 415D is inactive in response to the gating signal.

When the input signal at the node 420 is at the logic level HI, the NMOS transistor 415A enables functioning of the clock tree 400 by generating the output signal at the node 425. The PMOS transistor 430A and the NMOS transistor 415C enables functioning of the clock tree 400 in conjunction with the NMOS transistor 415A by being inactive. The PMOS transistor 430C enables functioning of the clock tree 400 by being active and generating the output signal at the node 440.

When the input signal at the node 420 is at the logic level LO during the clock generating mode then the NMOS transistor 415A, the NMOS transistor 415B, and the NMOS transistor 415D are inactive. The PMOS transistor 430A, the PMOS transistor 430B, and the PMOS transistor 430D are active. The output signal at the node 425 is at the logic level HI. The NMOS transistor 415C is active and the PMOS transistor 430C is inactive in response to the output signal at the node 425. The output signal at the node 440 is at the logic level LO.

When the input signal at the node 420 is at the logic level LO, the NMOS transistor 415A, and the PMOS transistor 430C enables functioning of the clock tree 400 by being inactive. The PMOS transistor 430A enables functioning of the clock tree 400 by generating the output signal at the node 425. The NMOS transistor 415C enables functioning of the clock tree 400 by generating the output signal at the node 440.

The NMOS transistor 415A, the NMOS transistor 415C, the PMOS transistor 430A and the PMOS transistor 430C can together be referred to as the critical portion of the clock tree 400. Each of the NMOS transistor 415A, the NMOS transistor 415C, the PMOS transistor 430A and the PMOS transistor 430C can be referred to as a critical transistor. The NMOS transistor 415A and the NMOS transistor 415C can be subject to a Positive Bias Temperature Instability (PBTI) effect, if kept active during the gating mode. The PBTI effect can occur due to applied voltage, temperature, aging or usage of NMOS transistors. The PBTI effect is observed when NMOS type transistors are active. The degradation reduces timing performance the clock tree 400 by generating delays.

During the gating mode, the input signal (first signal) at the node 420 is at the logic level LO. The NMOS transistor 415A is inactive and remains non-degraded. The gating signal (second signal) is at the logic level HI. The NMOS transistor 415B (non-critical transistor) is active in response to the gating signal and generates the output signal (third signal) at the node 425. The output signal at the node 425, which is at the logic level LO, inactivates the NMOS transistor 415C and prevents degradation. The NMOS transistor 415C (second critical transistor) can be referred to as the critical transistor subsequent to the NMOS transistor 415A (first critical transistor). Similarly, the NMOS transistor 415D is active in response to the gating signal and helps in inactivating NMOS transistor of the subsequent critical transistor. The PMOS transistor 430B and the PMOS transistor 430D are inactive, and the PMOS transistor 430A and the PMOS transistor 430C are active.

In some embodiments, the clock tree 400 includes several blocks. It is noted that the functioning and structure of each block can be similar to that of the block 405A.

Figure 5:
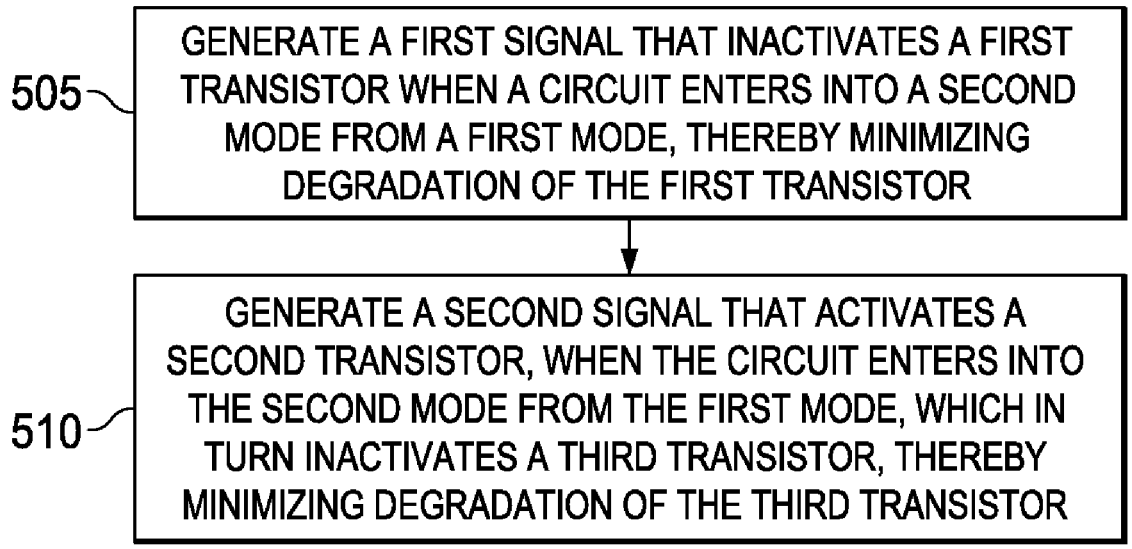
FIG. 5 illustrates a method for minimizing degradation in a circuit having multiple operating modes in accordance with one embodiment.

FIG. 5 illustrates a method for minimizing degradation in a circuit, for example the clock tree 300 or the clock tree 400, having multiple operating modes. At step 505, a first signal is generated. An input signal to the circuit at the logic level LO can be referred to as a first signal. The first signal inactivates a first transistor, for example the PMOS transistor 315A of the clock tree 300, when the clock tree enters into the gating mode (second mode) from the clock generating mode (first mode), thereby minimizing degradation of the first transistor. The first transistor enables functioning of the circuit in the clock generating mode.

At step 510, a second signal is generated. The second signal activates a second transistor, for example the PMOS transistor 315B, when the circuit enters into the gating mode from the clock generating mode. The second transistor, in turn, inactivates a third transistor, for example the PMOS transistor 315C, thereby minimizing degradation of the third transistor. The third transistor is subsequent to the first transistor and enables functioning of the circuit in the clock generating mode. A transistor that enables functioning of the circuit can be referred to as a functional transistor, for example the first transistor. The third transistor can be defined as the functional transistor subsequent to the first transistor.

In one embodiment, if the clock tree includes NAND based CTEs then the degradation is minimized in the clock tree, for example the clock tree 300. In another embodiment, if the clock tree includes NOR based CTEs then the degradation is minimized in the clock tree, for example the clock tree 400.

In some embodiments, the first transistor and the third transistor can be a set of transistors.

Figure 6:
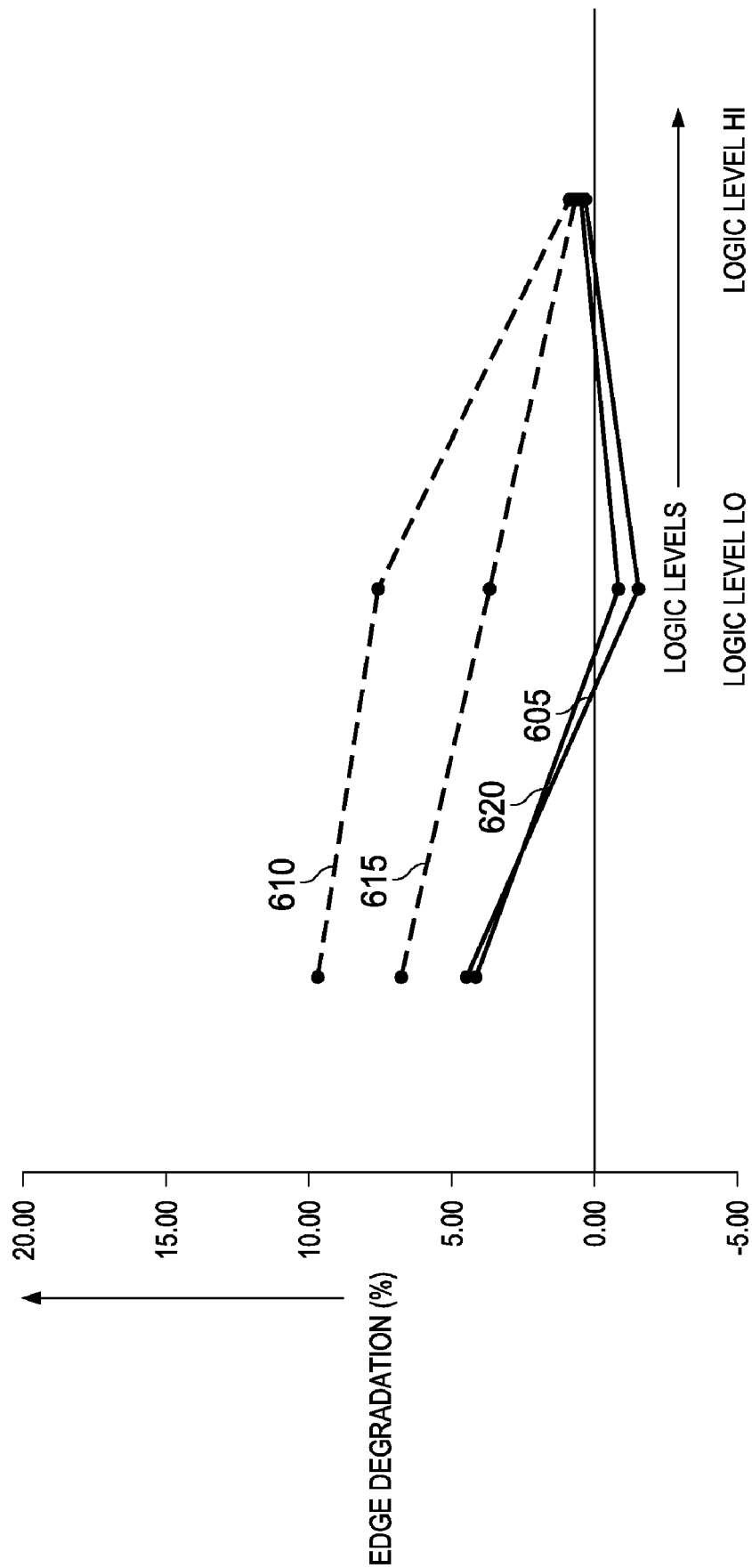
FIG. 6 illustrates performance of a NAND cell based clock tree in accordance with one embodiment.

FIG. 6 illustrates a graph representing performance of the NAND cell 310A1. Y-axis represents edge degradation, in percentage, and X-axis represents logic levels of the gating signal. A waveform 605, a waveform 610, a waveform 615, and a waveform 620 correspond to edge degradation in the NAND cell 310A1 of the clock tree 300.

The waveform 610 and the waveform 615 correspond to fall edge degradation of the NAND cell 310A1 and fall edge degradation of sized NAND cell 310A1. The waveform 605 and the waveform 620 correspond to the rise edge degradation of the NAND cell 310A1 and the rise edge degradation of sized NAND cell 310A1.

When the gating signal is at the logic level LO, then the edge degradation for the waveform 605 is less than zero percent. When the gating signal is at a logic level HI, then the edge degradation for the waveform 605 is equal to zero percent. Thus, the waveform 605 represents minimized degradation of the NAND cell 310A1.

When the gating signal is at the logic level LO, then edge degradation for the waveform 610 is greater than five percent. When the gating signal is at the logic level HI, then the edge degradation for the waveform 610 is equal to zero percent. Thus, the waveform 610 represents fall edge degradation of the NAND cell 310A1.

When the gating signal is at a logic level LO, then edge degradation for the waveform 615 is greater than three percent. When the gating signal is at a logic level HI, then the edge degradation for the waveform 615 is equal to zero percent. Thus, the waveform 615 represents fall edge degradation of the sized NAND cell 310A1.

When the gating signal is at the logic level LO, then degradation for the waveform 620 is less than zero percent. When the gating signal is at the logic level HI, then the edge degradation for the waveform 620 is equal to zero percent. Thus, the waveform 615 represents minimized degradation of the sized NAND cell 310A1.

In the foregoing discussion, the term "coupled" refers to either a direct electrical connection between the devices coupled or an indirect connection through intermediary devices. The term "circuit" means at least either a single component or a multiplicity of components, that are coupled together to provide a desired function. The term "signal" means at least one current, voltage, charge, data, or other signal. The term "prevent" or "preventing" refers to minimization.

Those skilled in the art will recognize that a wide variety of modifications, alterations, and combinations can be made with respect to the above described embodiments without departing from the scope of the disclosure, and that such modifications, alterations, and combinations are to be viewed as being within the ambit of the disclosure.

What is claimed is:

1. A circuit having multiple operating modes, the circuit comprising:
   a first transistor that enables functioning of the circuit in a first mode and is responsive to a first signal to become inactive when the circuit enters into a second mode, thereby preventing degradation of the first transistor when the circuit enters into the second mode;
   a second transistor coupled to the first transistor and that is responsive to a second signal to generate a third signal; and
   a third transistor coupled to the second transistor and is responsive to the third signal to become inactive when the circuit enters into the second mode, thereby preventing degradation of the third transistor when the circuit enters into the second mode;

wherein the first transistor and the third transistor are widely sized than the second transistor.

2. The circuit as claimed in claim 1, wherein circuit is comprised in a clock tree.

3. The circuit as claimed in claim 2, wherein
the first mode is a clock generating mode; and
the second mode is a gating mode.

4. The circuit as claimed in claim 3, wherein the first transistor is in parallel connection with the second transistor.

5. The circuit as claimed in claim 4, wherein
the first transistor comprises a first positive metal oxide semiconductor (PMOS) transistor; and
the second transistor comprises a second PMOS transistor.

6. The circuit as claimed in claim 5 and further comprising:
a first negative metal oxide semiconductor (NMOS) transistor in series connection with the first PMOS to enable functioning of the circuit in conjunction with the first PMOS transistor; and
a second NMOS transistor in series connection with the first NMOS transistor to enable generation of the third signal in the second mode,
the first PMOS, the second PMOS, the first NMOS and the second NMOS forming a first NAND cell based clock tree element.

7. The circuit as claimed in claim 6, wherein the third transistor is a third PMOS transistor having a gate coupled to a drain of the second PMOS transistor, the third transistor being comprised in a second NAND cell based dock tree element.

8. The circuit as claimed in claim 5, wherein
the first transistor comprises a first negative metal oxide semiconductor (NMOS) transistor; and
the second transistor comprises a second NMOS transistor.

9. The circuit as claimed in claim 8 and further comprising:
a first positive metal oxide semiconductor (PMOS) transistor in series connection with the first NMOS transistor to enable functioning of the circuit in conjunction with the first NMOS transistor; and
a second PMOS transistor in series connection with the first PMOS transistor to enable generation of the third signal in the second mode,
the first NMOS, the second NMOS, the first PMOS and the second PMOS forming a first NOR cell based clock tree element.

10. The circuit as claimed in claim 9, wherein the third transistor is a third NMOS transistor having a gate coupled to a drain of the second NMOS transistor, the third transistor being comprised in a second NOR cell based clock tree element.

11. A clock tree having multiple operating modes, the clock tree comprising
a plurality of transistor based clock tree elements (CTEs), a first one of the plurality of CTEs comprising a first transistor in parallel connection with a second transistor, a second one of the plurality of the CTEs comprising a third transistor in parallel connection with a fourth transistor, the third transistor coupled to the second transistor, the first transistor responsive to an input signal to enter into an inactive state when the clock tree enters into a gating mode and the second transistor responsive to a gating signal to inactivate the third transistor, thereby preventing degradation of the first transistor and the third transistor when the clock tree enters into the gating mode,
wherein the first transistor and the third transistor are widely sized than the second transistor.

12. The clock tree as claimed in claim 11, wherein
the first one of the plurality of CTEs further comprises
a fifth transistor in series connection with the first transistor to enable functioning of the clock tree in conjunction with the first transistor, and
a sixth transistor in series connection with the fifth transistor to inactivate the third transistor in response to the gating signal;
and
the second one of the plurality of CTEs further comprises
a seventh transistor in series connection with the third transistor to enable functioning of the clock tree in conjunction with the third transistor, and
an eighth transistor in series connection with the seventh transistor.

13. The clock tree as claimed in claim 11, where in the plurality of CTEs are one of:
NAND based CTEs, wherein the first transistor, the second transistor, the third transistor and the fourth transistor are positive metal oxide semiconductor (PMOS) type transistors, and the fifth transistor, the sixth transistor, the seventh transistor and the eighth transistor are negative metal oxide semiconductor (NMOS) type transistors;
and
NOR based CTEs, wherein the first transistor, the second transistor, the third transistor and the fourth transistor are NMOS type transistors, and the fifth transistor, the sixth transistor, the seventh transistor and the eighth transistor are PMOS type transistors.

14. A method for minimizing degradation in a circuit having multiple operating modes, the method comprising:
generating a first signal that inactivates a first transistor when the circuit enters into a second mode from a first mode, thereby minimizing degradation of the first transistor, the first transistor enabling functioning of the circuit in the first mode; and
generating a second signal that activates a second transistor, when the circuit enters into the second mode from the first mode, which in turn inactivates a third transistor, thereby minimizing degradation of the third transistor, the third transistor enabling functioning of the circuit in the first mode and being subsequent to the first transistor
wherein the first transistor and the third transistor are widely sized than the second transistor.

15. The method as claimed in claim 14, wherein the first mode is a clock generating mode and the second mode is a gating mode.

16. The method as claimed in claim 15, wherein the circuit is one of:
a NAND cell based clock tree; and
a NOR cell based clock tree.

17. A NAND cell, comprising:
first, second, and third nodes;
a first PMOS transistor having a gate coupled to the first node and a drain coupled to the second node;
a second PMOS transistor in parallel with the first PMOS transistor, and the second PMOS transistor having a gate coupled to the third node and a drain coupled to the second node; and
first and second NMOS transistors in series with the first PMOS transistor,
wherein the second NMOS transistor has a gate coupled to the third node and a drain coupled to a source of the first PMOS transistor, and the first NMOS transistor as a gate coupled to the first node and a drain coupled to the second node,
and the NAND cell minimizes transistor degradation,
wherein the first transistor and the third transistor are widely sized than the second transistor.

* * * * *